United States Patent
Chang et al.

(10) Patent No.: US 11,373,967 B2
(45) Date of Patent: Jun. 28, 2022

(54) SEMICONDUCTOR DEVICE PACKAGE AND METHOD FOR PACKAGING THE SAME

(71) Applicant: Advanced Semiconductor Engineering, Inc., Kaohsiung (TW)

(72) Inventors: Yung-Shun Chang, Kaohsiung (TW); Teck-Chong Lee, Kaohsiung (TW); Sheng-Wen Yang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 12 days.

(21) Appl. No.: 16/684,353

(22) Filed: Nov. 14, 2019

(65) Prior Publication Data

US 2021/0151398 A1 May 20, 2021

(51) Int. Cl.
| | |
|---|---|
| H01L 25/065 | (2006.01) |
| H01L 25/00 | (2006.01) |
| H01L 21/768 | (2006.01) |
| H01L 23/00 | (2006.01) |
| H01L 23/31 | (2006.01) |

(52) U.S. Cl.
CPC .......... *H01L 24/05* (2013.01); *H01L 23/3114* (2013.01); *H01L 24/80* (2013.01); *H01L 2224/0235* (2013.01); *H01L 2224/02371* (2013.01); *H01L 2224/04105* (2013.01)

(58) Field of Classification Search
CPC ..... H01L 24/05; H01L 23/3114; H01L 24/80; H01L 2224/0235; H01L 2224/02371; H01L 2224/04105; H01L 27/14–14893
See application file for complete search history.

(56) References Cited

U.S. PATENT DOCUMENTS

| | | | | |
|---|---|---|---|---|
| 8,229,255 B2* | 7/2012 | Wober | ................. | G02B 6/4204 385/12 |
| 9,691,708 B1* | 6/2017 | Huang | ................. | H01L 23/5389 |
| 10,879,292 B2* | 12/2020 | Jang | ................... | H01L 27/14634 |
| 2008/0211045 A1* | 9/2008 | Ono | .................... | H01L 27/14685 257/432 |
| 2013/0134455 A1* | 5/2013 | Tanaka | ................ | H01L 25/0753 257/88 |
| 2014/0070348 A1* | 3/2014 | Yee | ...................... | H01L 27/1464 257/432 |
| 2014/0231983 A1* | 8/2014 | Sugo | ........................ | H01L 24/29 257/734 |
| 2016/0172402 A1* | 6/2016 | Katkar | ................ | H01L 27/1469 257/292 |
| 2017/0108372 A1* | 4/2017 | Reichel | ................... | G01J 1/429 |

(Continued)

OTHER PUBLICATIONS

Guo-Wei et al., Effect of Cu stud microstructure and electroplating process on intermetallic compounds growth and reliability of flip-chip solder bump, IEEE Transactions, 24:4, 2001 (Year: 2001).*

*Primary Examiner* — Brigitte A Paterson
*Assistant Examiner* — Tenley H Schofield
(74) *Attorney, Agent, or Firm* — Foley & Lardner LLP

(57) ABSTRACT

A semiconductor device package includes a first semiconductor device; a second semiconductor device; and a first redistribution layer disposed on the first semiconductor device and having a side wall defining an opening that exposes the first semiconductor device. The side wall of the first redistribution layer has an average surface roughness (Ra) in a range up to 2 micrometers (μm).

13 Claims, 35 Drawing Sheets

(56) References Cited

U.S. PATENT DOCUMENTS

2017/0345761 A1* 11/2017 Yu ........................ H01L 21/565
2018/0076244 A1*  3/2018 Wu ................... H01L 27/14636
2018/0337142 A1* 11/2018 Cheng ..................... H01L 24/20
2019/0157206 A1*  5/2019 Wang ...................... H01L 24/19
2020/0310052 A1* 10/2020 Lim ..................... G02B 6/4255

* cited by examiner

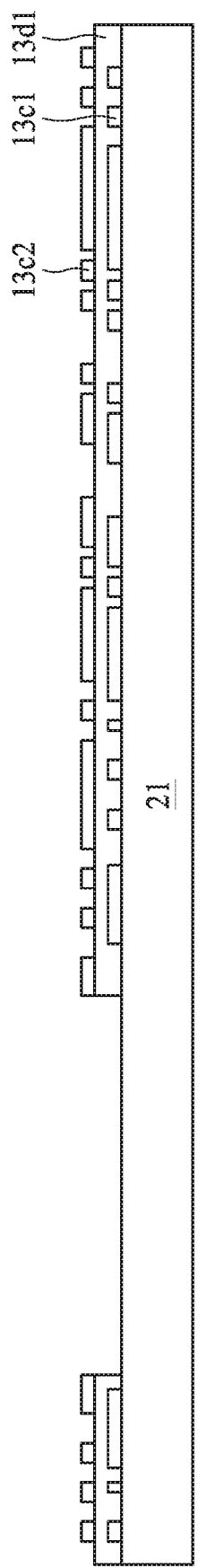

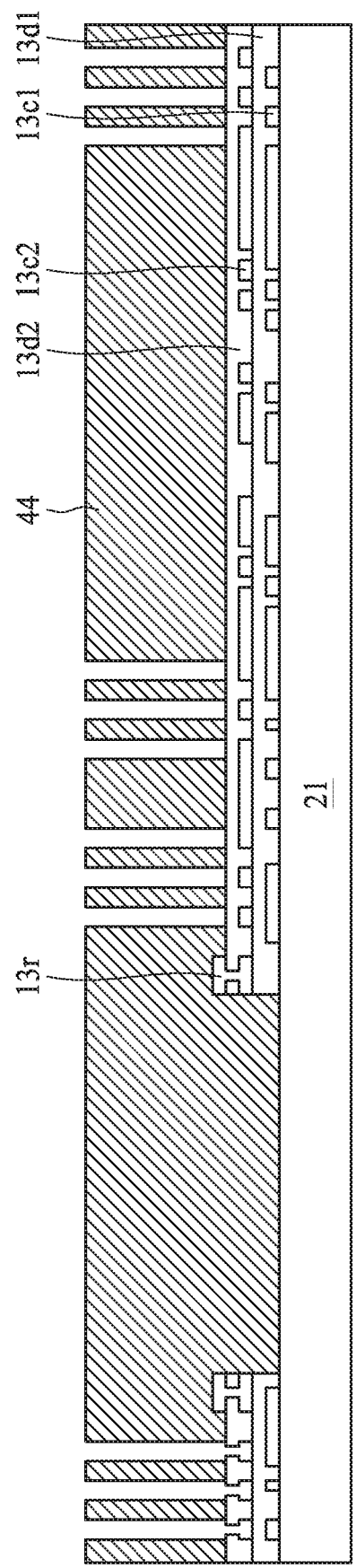

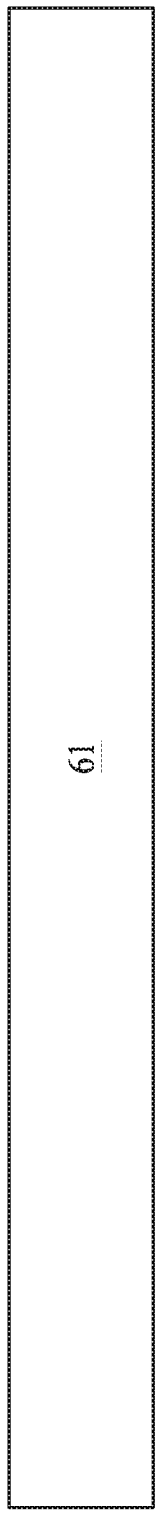

SEMICONDUCTOR DEVICE PACKAGE AND METHOD FOR PACKAGING THE SAME

TECHNICAL FIELD

The present disclosure generally relates to a semiconductor device package and a method for packaging the same.

BACKGROUND

A semiconductor device package can include a semiconductor device having a working area (e.g. a sensing area of a sensor or a light emitting area of an illumination component). In some implementations, the working area of the semiconductor device should be substantially devoid of contamination. However, during manufacturing, some operations may contaminate or damage the working area of the semiconductor device, which may adversely affect the performance of the semiconductor device package.

SUMMARY

In some embodiments, according to one aspect, a semiconductor device package includes a first semiconductor device; a second semiconductor device; and a first redistribution layer disposed on the first semiconductor device and having a side wall defining an opening that exposes the first semiconductor device. The side wall of the first redistribution layer has an average surface roughness (Ra) in a range up to 2 micrometers (μm).

In some embodiments, according to another aspect, a method for packaging a semiconductor device includes forming a redistribution layer; defining an opening in the redistribution layer, the opening having a side wall having an average surface roughness (Ra) in a range up to 2 micrometers (μm); and attaching a first semiconductor device to the redistribution layer such that a portion of the first semiconductor device is exposed by the opening.

BRIEF DESCRIPTION OF THE DRAWINGS

Aspects of the present disclosure are readily understood from the following detailed description when read with the accompanying figures. It is noted that various features may not be drawn to scale, and the dimensions of the various features may be arbitrarily increased or reduced for clarity of discussion.

FIG. 4A, FIG. 4B, FIG. 4C, FIG. 4D, FIG. 4E, FIG. 4F, FIG. 4G, FIG. 4H, FIG. 4I and FIG. 4J illustrate a method for forming an opening in accordance with some embodiments of the present disclosure.

FIG. 6A, FIG. 6B, FIG. 6C and FIG. 6D illustrate a method for packaging a semiconductor device in accordance with some embodiments of the present disclosure. In some embodiments, the method in FIG. 6A, FIG. 6B, FIG. 6C and FIG. 6D can be used for packaging the semiconductor device shown in FIG. 5.

DETAILED DESCRIPTION

Figure 1:
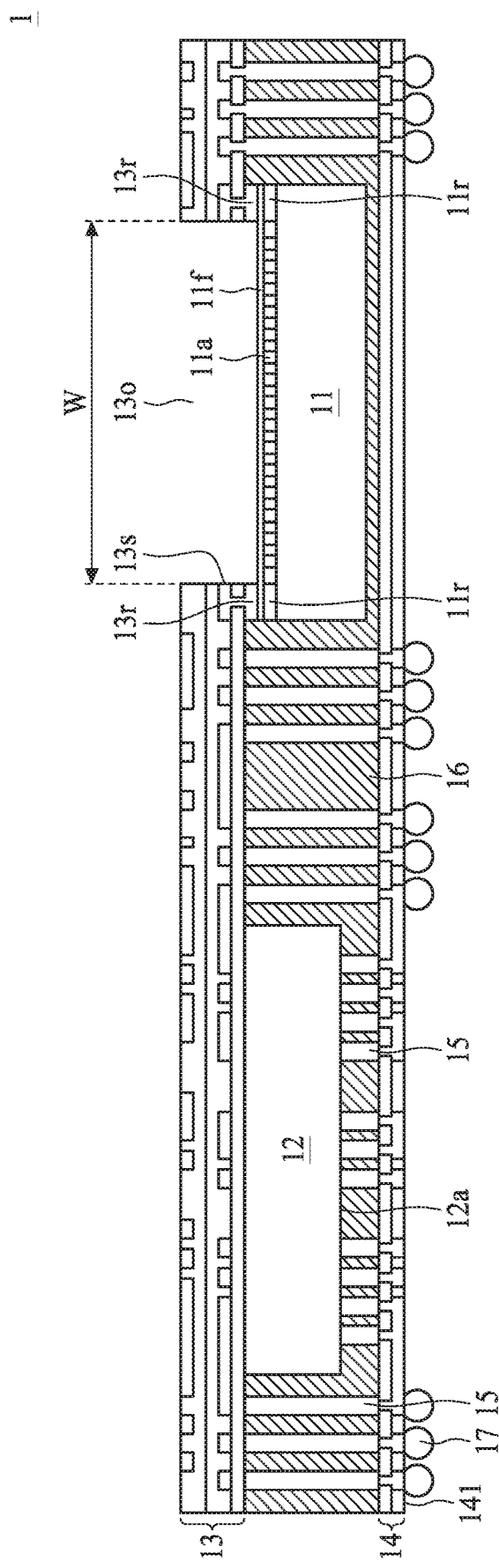
FIG. 1 is a schematic diagram illustrating a cross-sectional view of a semiconductor device package according to some embodiments of the present disclosure.

Embodiments of the present disclosure and use thereof are discussed in detail below. It should be appreciated, however, that the embodiments set forth many applicable concepts that can be embodied in a wide variety of specific contexts. It is to be understood that the following disclosure provides for many different embodiments or examples of implementing different features of various embodiments. Specific examples of components and arrangements are described below for purposes of discussion. These are, of course, merely examples and are not intended to be limiting.

Spatial descriptions, including such terms as "above," "below," "up," "left," "right," "down," "top," "bottom," "vertical," "horizontal," "side," "higher," "lower," "upper," "over," "under," and so forth, are used herein with respect to an orientation shown in corresponding figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

In addition, the present disclosure may repeat reference numerals and/or letters in the various examples. This repetition is for the purpose of simplicity and clarity and does not in itself dictate a relationship between the various embodiments and/or configurations discussed herein.

The present disclosure provides for a semiconductor device package and a method for packaging the same. Embodiments of semiconductor device packages and methods described herein provide for some semiconductor device packages having features that alleviate, mitigate, reduce, or avoid contamination of a working area of the semiconductor device. The design of the semiconductor device packages according to some embodiments of the present disclosure can reduce an average surface roughness (Ra) value of a side wall of a redistribution layer used in the semiconductor device packages (e.g. to ensure proper performance or improved performance of lighting of a display module of the semiconductor device packages).

FIG. 1 is a schematic diagram illustrating a cross-sectional view of a semiconductor device package according to some embodiments of the present disclosure.

Referring to FIG. 1, the semiconductor device package 1 includes a semiconductor device 11, a semiconductor device 12, a redistribution layer 13, a redistribution layer 14, one or more conductive pillar 15, an encapsulant 16, and an electrical contact 17.

In some embodiments, the semiconductor device package 1 is applied to, or used in, a display or a display module. The semiconductor device 11 is, for example, a backplane integrated circuit (IC) including optical lighting components such as red, green, or blue (R/G/B) light emitting diodes (LEDs). The semiconductor device 12 is, for example, a driver IC. The semiconductor device 12 is electrically connected to the semiconductor device 11 and is configured to drive the semiconductor device 11 such that the semiconductor device 11 can achieve full color illumination output by the color mixing principle of the three primary colors (R/G/B). In the presently described embodiment, the semiconductor device 11 and the semiconductor device 12 are disposed in a side-by-side manner (e.g. adjacent to each other, such as in a direction from a first edge of the semiconductor device package 1 to a second edge of the semiconductor device package 1).

The redistribution layer 13 is disposed on the semiconductor device 11 and has a side wall 13s. The side wall 13s defines an opening 13o that exposes the semiconductor device 11. As used herein, the side wall 13s may be referred to as a side wall of the opening 13o. In some embodiments, the opening 13o is pre-formed before mounting the semiconductor device 11. The side wall 13s of the redistribution layer 13 can have a relatively lesser surface roughness than certain other components of the semiconductor device package 1, or than a side wall of a redistribution layer included in certain comparative semiconductor device packages. For example, the side wall 13s of the redistribution layer 13 has an Ra in a range up to about 2 micrometers (μm), such as from about 0.1 μm to about 2.0 μm. For example, the side wall 13s of the redistribution layer 13 has an Ra in a range from about 0.1 μm to about 1.5 μm. For example, the side wall 13s of the redistribution layer 13 has an Ra in a range from about 0.1 μm to about 1.0 μm. For example, the side wall 13s of the redistribution layer 13 has an Ra in a range from about 0.1 μm to about 0.5 μm. For example, the side wall 13s of the redistribution layer 13 has an Ra in a range from about 0.1 μm to about 0.2 μm. Implementation of such a side wall may provide for at least some of the advantages described herein.

The opening 13o of the redistribution layer 13 exposes a portion or an exposed area of the semiconductor device 11 (e.g., a portion of a surface of the semiconductor device 11, or an entirety of the surface of the semiconductor device 11). The opening 13o has a width W which is substantially the same as a width of the exposed area of the semiconductor device 11. The opening 13o has a dimension substantially the same as a dimension of the area of the semiconductor device 11. An active surface 11a of the semiconductor device 11 faces toward the redistribution layer 13 and/or the opening 13o, and the exposed area may be an area of the active surface 11a. The opening 13o provides for light being emitted by optical lighting components of the semiconductor device 11 through the opening 13o away from the semiconductor device package 1.

The semiconductor device 11 has a ring structure 11r. The redistribution layer 13 has a ring structure 13r. The ring structure 13r of the redistribution layer 13 encloses (e.g. encircles or surrounds) the side wall 13s of the redistribution layer 13. The ring structure 11r of the semiconductor device 11 substantially matches the ring structure 13r of the redistribution layer 13 (e.g., has a substantially same size and/or shape). The ring structure 11r of the semiconductor device 11 attaches to the ring structure 13r of the redistribution layer 13 through an adhesive layer (e.g., a tape or an adhesive film). A protective film 11f can be disposed on the active surface 11a of the semiconductor device 11. In some embodiments, there is no protective film disposed on the active surface 11a of the semiconductor device 11, and the active surface 11a is devoid of a protective film.

The redistribution layer 14 is opposite to the redistribution layer 13 (e.g. the redistribution layer 13 is disposed on a first side of the semiconductor device 11, and the redistribution layer 14 is disposed on a second side of the semiconductor device 11 opposite to the first side). An active surface 12a of the semiconductor device 12 is electrically connected to the redistribution layer 14 through one or more conductive pillars 15. The active surface 12a of the semiconductor device 12 faces away from the redistribution layer 13. In some other embodiments, the active surface 12a of the semiconductor device 12 can face toward the redistribution layer 13. The semiconductor device package 1 includes one or more conductive pillars 15 which surround the semiconductor device 12. The semiconductor device package 1 includes one or more conductive pillars 15 which connect the redistribution layer 13 to the redistribution layer 14. The conductive pillars 15 include a conductive material such as a metal or a metal alloy. Examples of the conductive material include gold (Au), silver (Ag), aluminum (Al), copper (Cu), or an alloy thereof.

The encapsulant 16 encapsulates the semiconductor device 11, the semiconductor device 12, and one or more conductive pillars 15. The encapsulant 16 encapsulates a portion of the semiconductor device 11. The encapsulant 16 encapsulates a portion of the semiconductor device 12. The encapsulant 16 encapsulates lateral surfaces of the one or more conductive pillars 15. The encapsulant 16 may include an epoxy resin, a molding compound (e.g., an epoxy molding compound (EMC) or other molding compound), or other suitable materials. An electrical contact 17 (e.g., a solder bump) is disposed on a bottom surface 141 of the redistribution layer 14.

FIG. 2A, FIG. 2B, FIG. 2C, FIG. 2D, FIG. 2E and FIG. 2F illustrate a method for packaging a semiconductor device in accordance with some embodiments of the present disclosure.

Figure 2A:
FIG. 2A, FIG. 2B, FIG. 2C, FIG. 2D, FIG. 2E and FIG. 2F illustrate a method for packaging a semiconductor device in accordance with some embodiments of the present disclosure.

Referring to FIG. 2A, a carrier 21 is provided. In some embodiments, there is an adhesive layer (e.g., a tape or an adhesive film) disposed on the carrier 21.

Figure 2B:
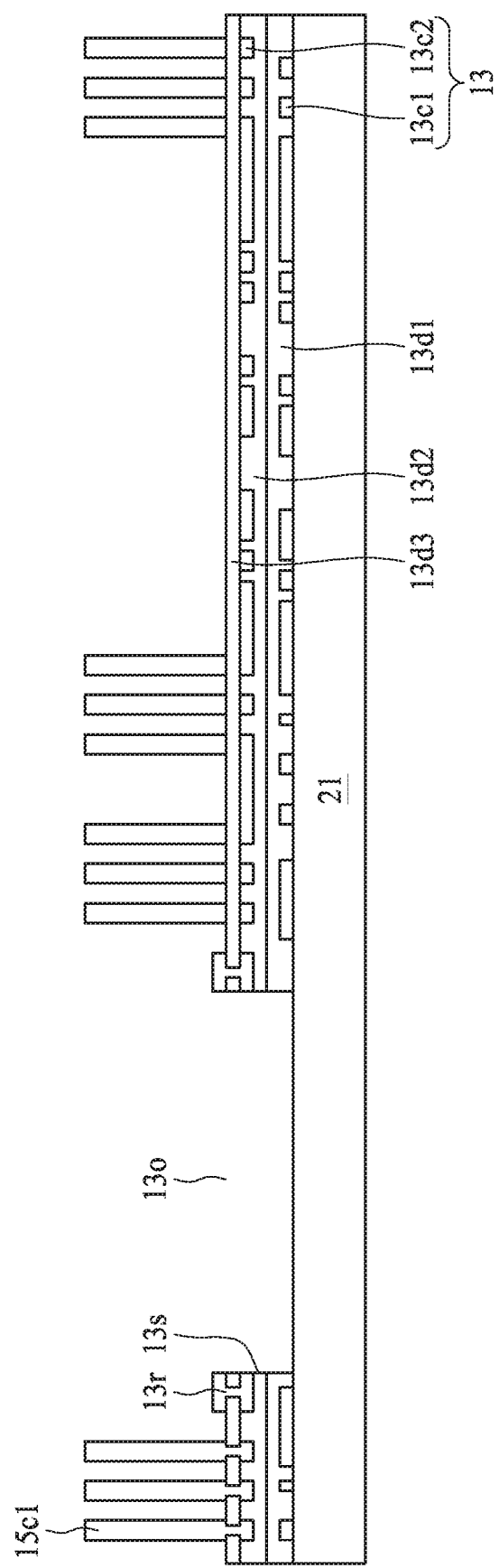

Referring to FIG. 2B, a redistribution layer 13 is formed on the carrier 21 and one or more conductive pillars 15c1 are formed on the redistribution layer 13. Specifically, a conductive layer 13c1 is formed on the carrier 21 and a dielectric layer 13d1 is formed on portions of the carrier and the conductive layer 13c1. The conductive layer 13c1 has an opening to expose a portion of the carrier 21. The dielectric layer 10d1 has an opening to expose the portion of the carrier 21. A dielectric layer 13d2 is formed on the dielectric layer 13d1. The dielectric layer 13d2 has an opening to expose the portion of the carrier 21. A conductive layer 13c2 is formed within the dielectric layer 13d2. The conductive layer 13c2 has an opening to expose the portion of the carrier 21. A dielectric layer 13d3 is formed on the dielectric layer 13d2. The dielectric layer 13d3 has an opening to expose the portion of the carrier 21 and has an opening to expose the conductive layer 13c2.

As shown in FIG. 2B, a ring structure 13r is formed on the dielectric layer 13d3. The ring structure 13r is connected to the conductive layer 13c2. The lateral surfaces of the dielectric layers 13d1, 13d2 and 13d3 and the ring structure 13r are substantially coplanar. The ring structure 13r of the redistribution layer 13 encloses the side wall 13s of the redistribution layer 13. The one or more conductive pillars 15c1 are formed on the dielectric layer 13d3.

Figure 2C:
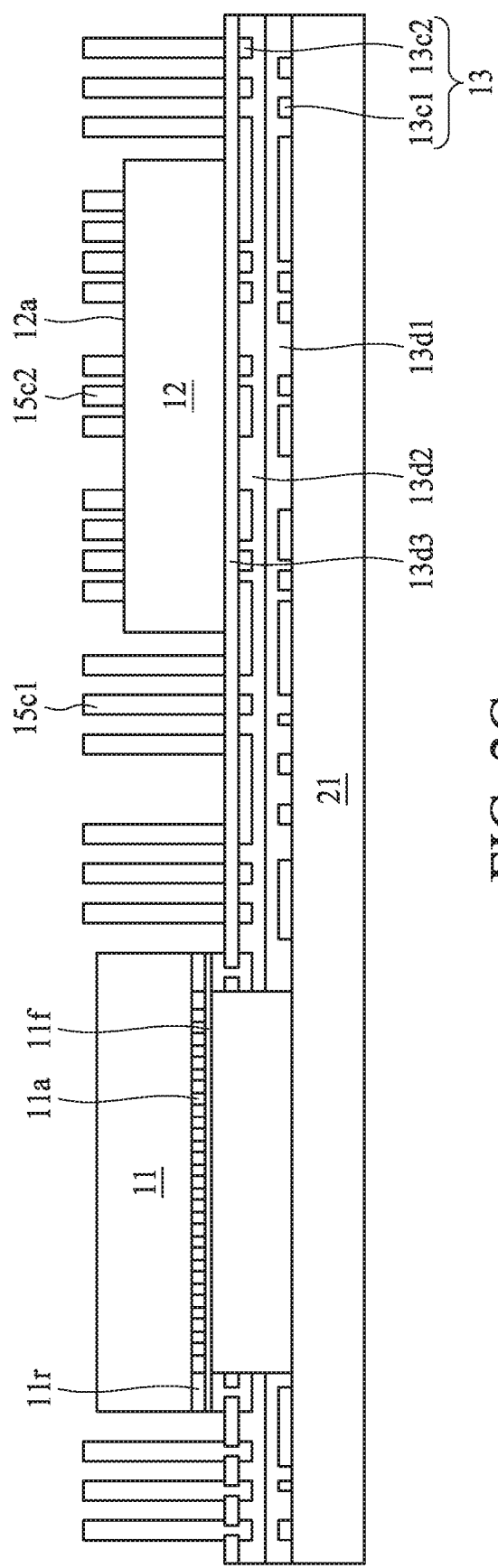

Referring to FIG. 2C, the semiconductor device 11 and the semiconductor device 12 are provided. One or more conductive pillars 15c1 are formed on the redistribution layer 13. The ring structure 11r of the semiconductor device 11 is attached to the ring structure 13r of the redistribution layer 13. The semiconductor device 12 is disposed on the surface of the dielectric layer 13d3. The one or more conductive pillars 15c2 are disposed on the active surface 12a of the semiconductor device 12.

Figure 2D:
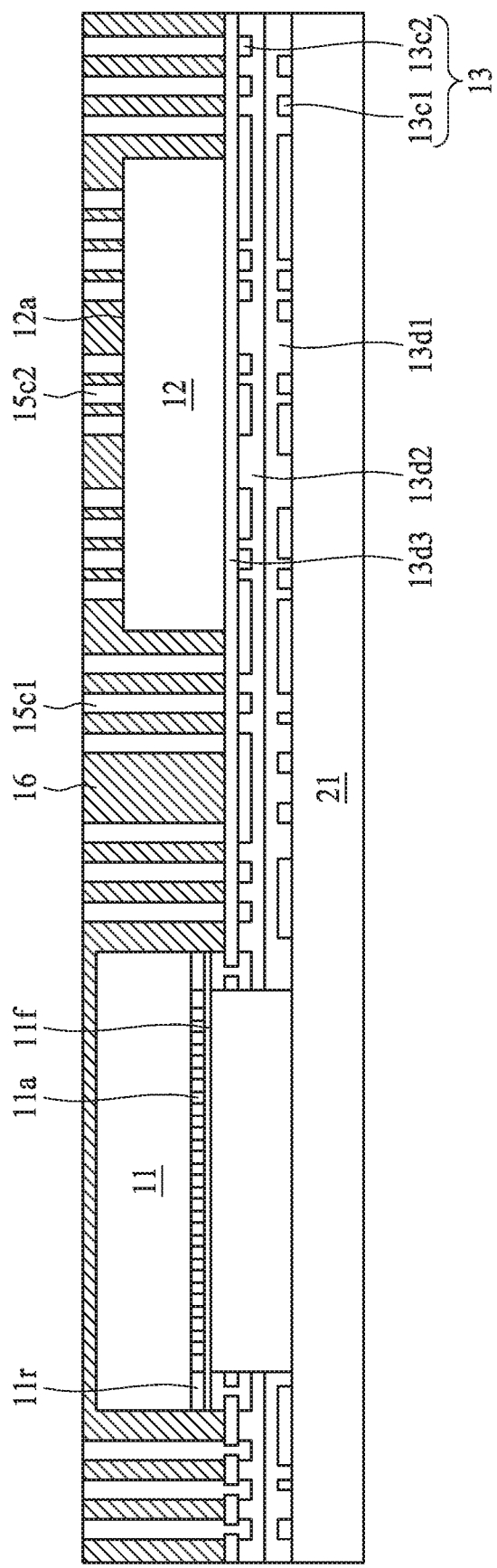
Figure 2E:
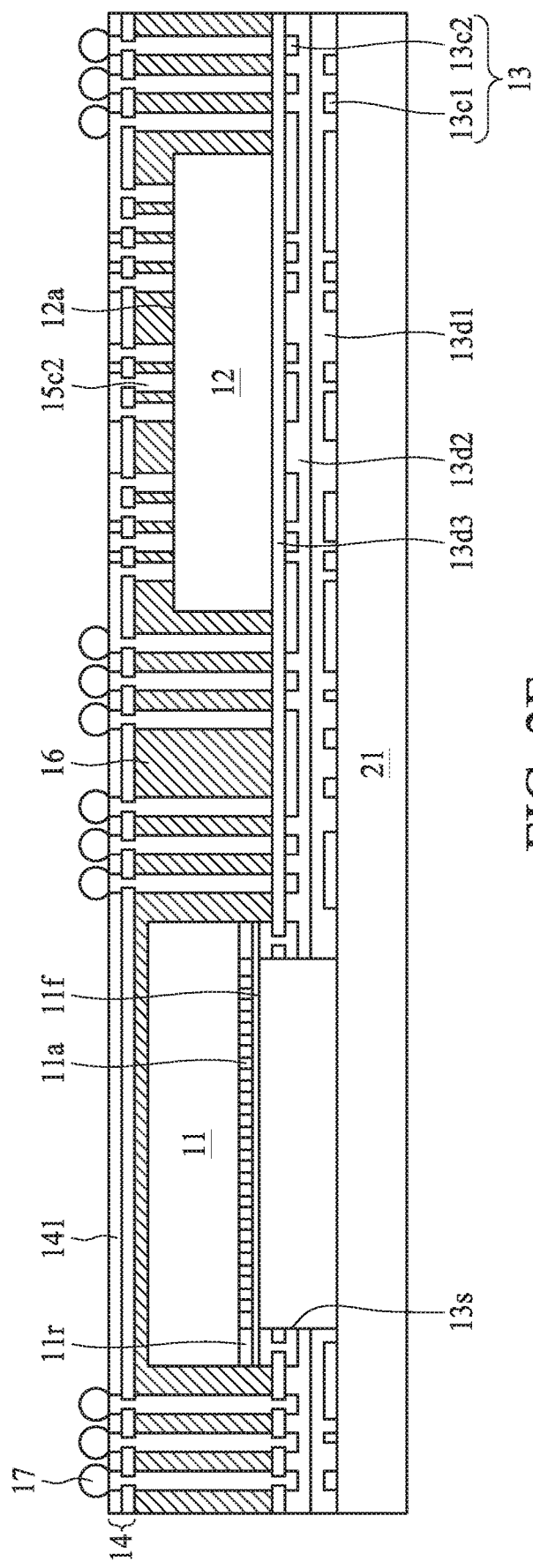
Figure 2F:
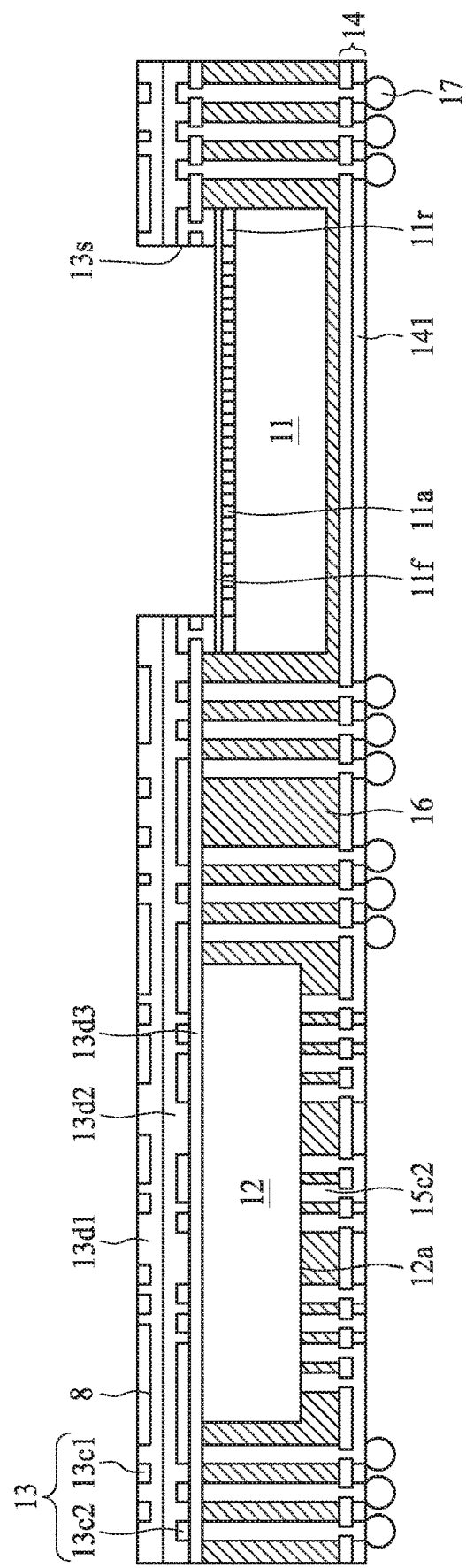

Referring to FIG. 2D, a portion of the semiconductor device 11, a portion of the semiconductor device 12, and lateral surfaces of the one or more conductive pillars 15c1 and 15c2 are encapsulated. Referring to FIG. 2E, the redistribution layer 14 is formed on the top surface of the conductive pillars 15c1 and 15c2. An electrical contact 17 is formed on the surface 141 of the redistribution layer 14. Referring to FIG. 2F, the carrier 21 is then removed to form the semiconductor device package 1 as shown in FIG. 1.

Figure 3A:
FIG. 3A, FIG. 3B, FIG. 3C, FIG. 3D, and FIG. 3E illustrate a method for forming an opening in accordance with some embodiments of the present disclosure.
Figure 3B:
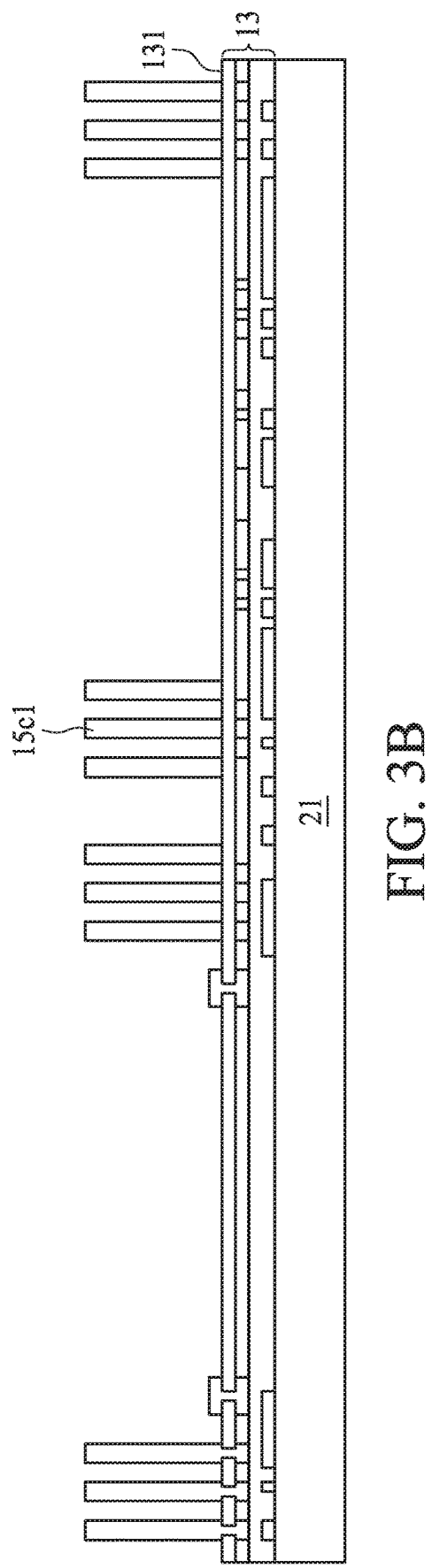
Figure 3C:
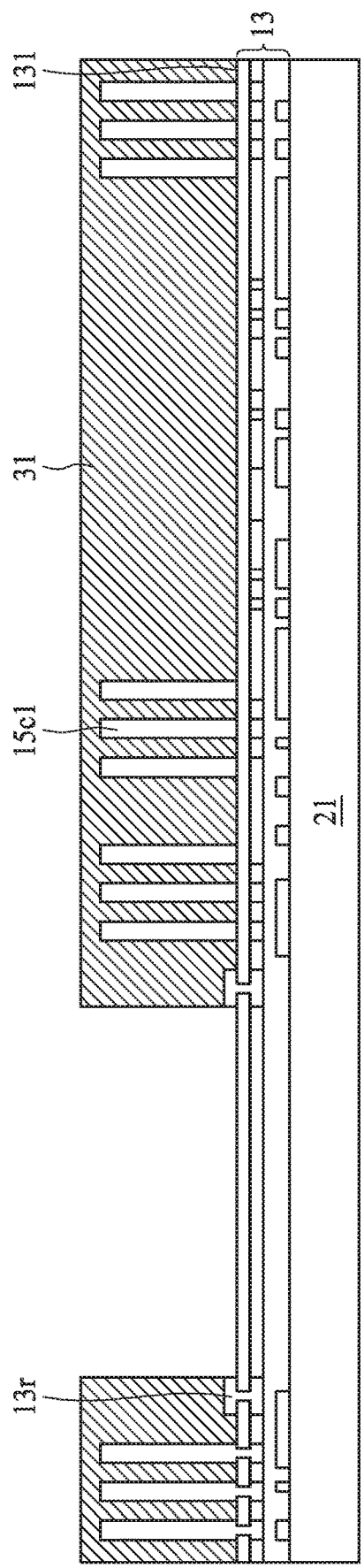
Figure 3D:
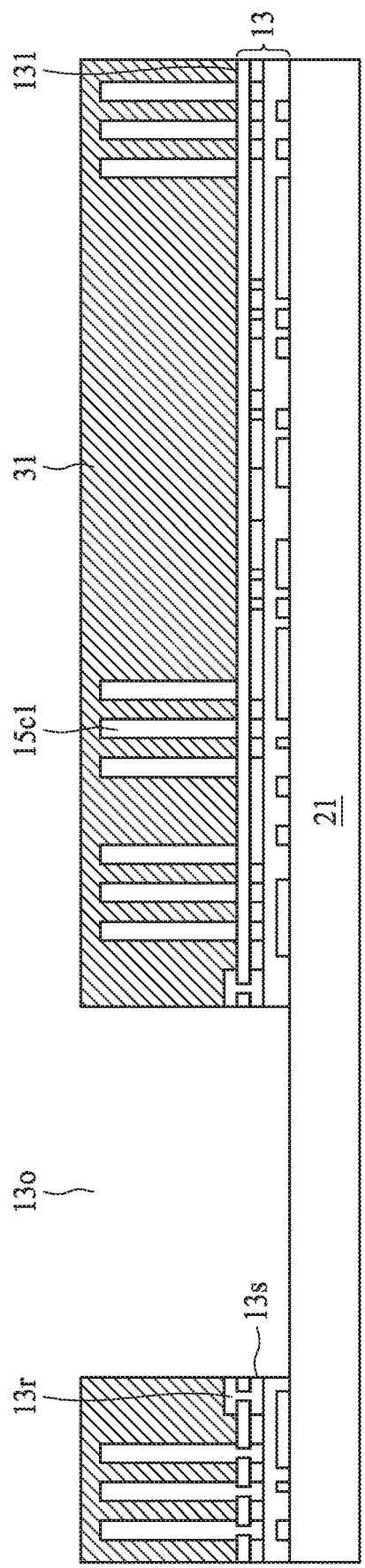

FIG. 3A, FIG. 3B, FIG. 3C, FIG. 3D, and FIG. 3E illustrate a method for forming an opening in accordance with some embodiments of the present disclosure. In some embodiments, the method in FIG. 3A, FIG. 3B, FIG. 3C, FIG. 3D, and FIG. 3E can be used to manufacture the opening 13o as shown in FIG. 1. In some embodiments, the operations in FIG. 3B, FIG. 3C and FIG. 3D are performed subsequent to the operation in FIG. 2A and in advance of the operation in FIG. 2B.

Referring to FIG. 3A, a carrier 21 is provided. In some embodiments, there is an adhesive layer (e.g., a tape or an adhesive film) disposed on the carrier 21. Referring to FIG. 3B, a redistribution layer 13 is formed on the carrier 21 and one or more conductive pillars 15c1 are formed on a surface 131 of the redistribution layer 13.

Figure 3E:
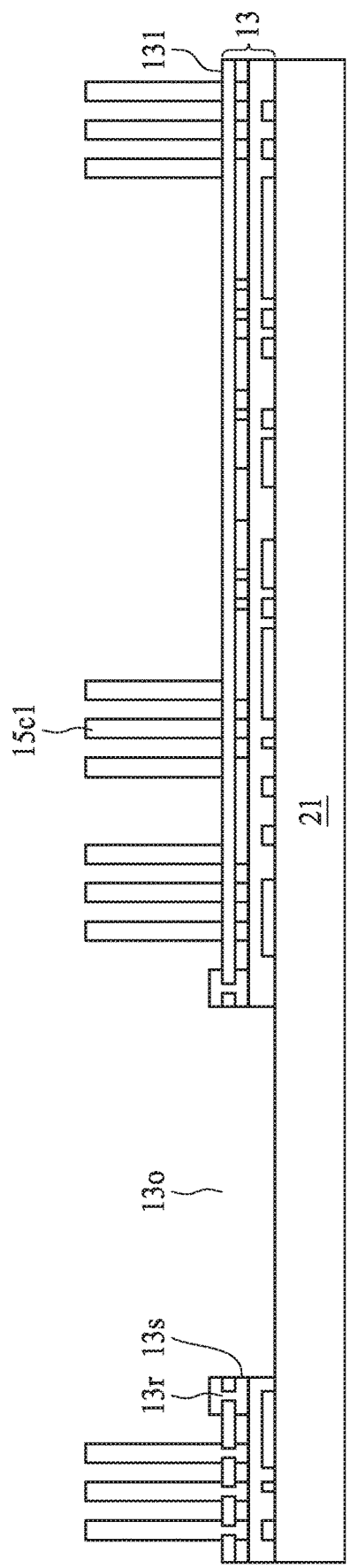

Referring to FIG. 3C, a photoresist 31 are provided to cover the one or more conductive pillars 15c1, a portion of the surface 131 of the redistribution layer 13 and a portion of the ring structure 13r. An area of the surface 131 of the redistribution layer 13 is exposed from the photoresist 31. A lateral surface of the ring structure 13r is exposed from the photo resist 31. Then, irradiating the structure shown in FIG. 3C with plasma so as to remove a portion of the redistribution layer 13 is performed, as shown in FIG. 3D. In some embodiments, the side wall 13s of the redistribution layer 13 has an Ra in a range from about 1.0 μm to about 2.0 μm. Referring to FIG. 3E, the photoresist 31 is then removed.

FIG. 4A, FIG. 4B, FIG. 4C, FIG. 4D, FIG. 4E, FIG. 4F, FIG. 4G, FIG. 4H, FIG. 4I and FIG. 4J illustrate a method for forming an opening in accordance with some embodiments of the present disclosure. In some embodiments, the method in FIG. 4A, FIG. 4B, FIG. 4C, FIG. 4D, FIG. 4E, FIG. 4F, FIG. 4G, FIG. 4H, FIG. 4I and FIG. 4J can be used to manufacture the opening 13o as shown in FIG. 1.

Figure 4A:
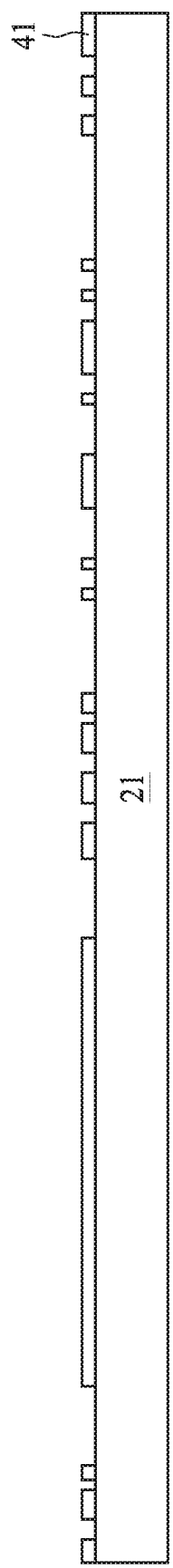

Referring to FIG. 4A, a carrier 21 and a photoresist layer 41 are provided. The photoresist layer 41 is in contact with the carrier 21. The photoresist layer 41 has (defines) one or more openings. The photoresist layer 41 includes a positive resist or a negative resist. In some embodiments, the openings of the photoresist layer 41 are formed by exposing a photoresist layer to UV light, light with shorter wavelength than UV light, or electron-beams through a mask, and etching the exposed photoresist layer with photoresist developer. In some embodiments, the unexposed portion of the photoresist remains insoluble to the photoresist developer. In some embodiments, the unexposed portion of the photoresist is dissolved, at least to some extent (e.g., less than the exposed portion of the photoresist), by the photoresist developer.

Figure 4B:
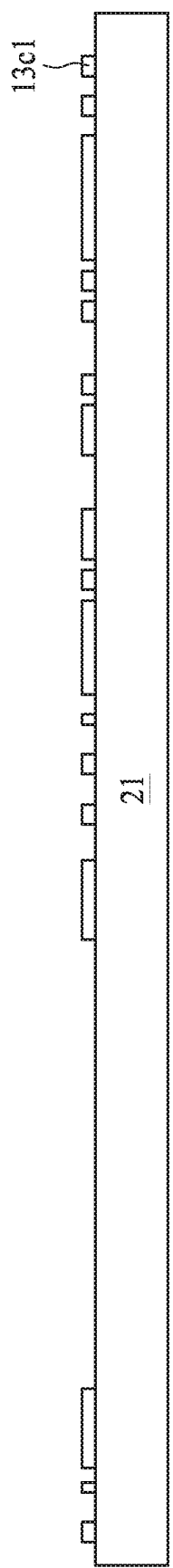

Referring to FIG. 4B, a conductive layer 13c1 is provided. The conductive layer 13c1 is in contact with the carrier 21. The conductive layer 13c1 has openings. The conductive layer 13c1 is formed using the photoresist layer 41. In some embodiments, the conductive layer 13c1 is formed by physical vapor deposition, such as vapor deposition, sputtering, or pulsed laser ablation. In some embodiments, a seed layer is formed before forming the conductive layer 13c1. The seed layer may include titanium copper. After the conductive layer 13c1 is formed in the openings of the photoresist layer 14, the photoresist layer 14 is removed or striped by a solvent or a plasma. The conductive layer 13c1 thus has one or more openings exposing portions of the carrier 21.

Figure 4C:
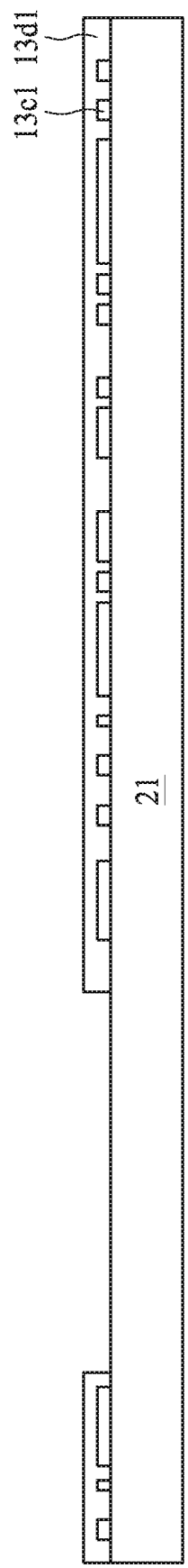

Referring to FIG. 4C, a dielectric layer 13d1 is provided. Portions of the dielectric layer 13d1 are in contact with the carrier 21. The conductive layer 13c1 is not exposed from the dielectric layer 13d1 (e.g. is substantially covered by the dielectric layer 13d1). The dielectric layer 13d1 can be formed by deposition, applying, or coating, for example. A portion of the carrier 21 is exposed. Before the dielectric layer 13d1 is formed, a barrier (e.g., a photoresist) may be formed over a portion of the carrier 21 that is to be exposed. After the dielectric layer 13d1 is formed, the barrier is removed or striped such that a portion of the carrier 21 is exposed.

Figure 4D:
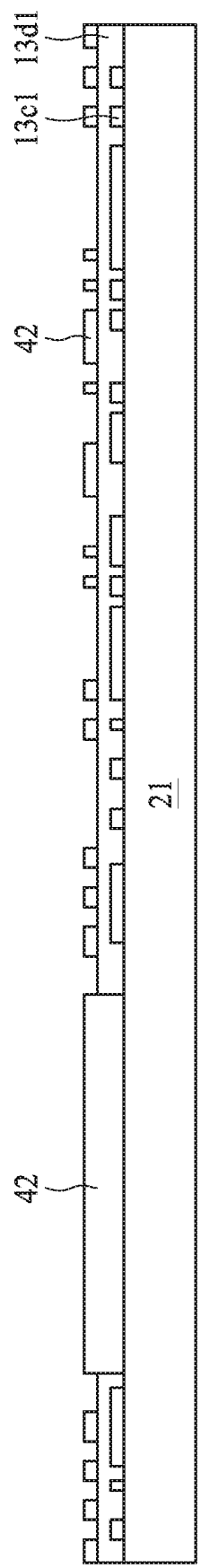

Referring to FIG. 4D, a photoresist layer 42 is formed. A portion of the photoresist layer 42 is in contact with the carrier 21. Portions of photoresist layer 42 are in contact with the dielectric layer 13d1. The photoresist layer 42 includes one or more openings. In some embodiments, forming the photoresist layer 42 includes: applying a photoresist layer, exposing the photoresist through a mask, and etching the photoresist layer. A portion of the photoresist layer 42 is in contact with the carrier 21.

Referring to FIG. 4E, a conductive layer 13c2 is formed. The conductive layer 13c2 is in contact with the dielectric layer 13d1. In some embodiments, forming the conductive layer 13c2 includes forming the conductive layer 13c2 by physical vapor deposition and removing (or striping) the photoresist layer 42. In some embodiments, a seed layer including titanium copper is formed before forming the conductive layer 13c2. The conductive layer 13c2 includes one or more openings exposing portions of the dielectric layer 13d1. A portion of the carrier 21 is exposed.

Figure 4F:
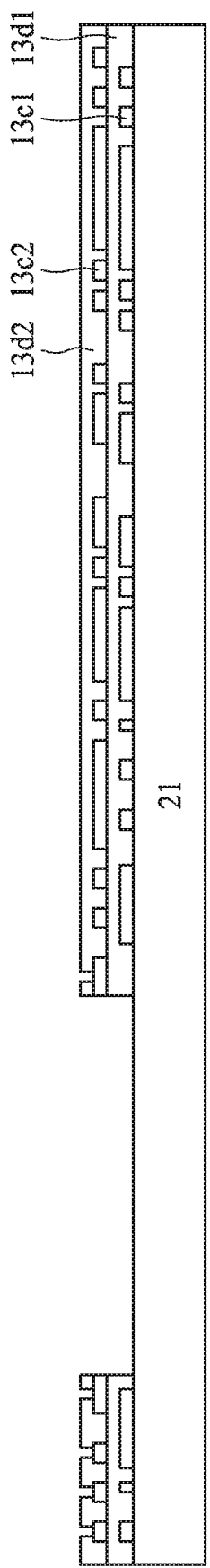

Referring to FIG. 4F, a dielectric layer 13d2 is formed. Portions of the dielectric layer 13d2 are in contact with the dielectric layer 13d1. Portions of the dielectric layer 13d2 are in contact with the conductive layer 13c2. Portions of the conductive layer 13c2 are exposed from the dielectric layer 13d2. The dielectric layer 13d2 has one or more openings, and portions of the conductive layer 13c2 are exposed by the openings of the dielectric layer 13d2. The dielectric layer 13d2 can be formed by deposition, applying, or coating, for example. A portion of the carrier 21 is exposed. Before the dielectric layer 13d2 is formed, a barrier layer (e.g., a photoresist) is formed. After the dielectric layer 13d2 is formed, the barrier layer is removed such that a portion of the carrier 21 and portions of conductive layer 13c2 are exposed from the dielectric layer 13d2. In some embodiments, the dielectric layer 13d2 include two dielectric layers (e.g., dielectric layers 13d2 and 13d3).

Figure 4G:
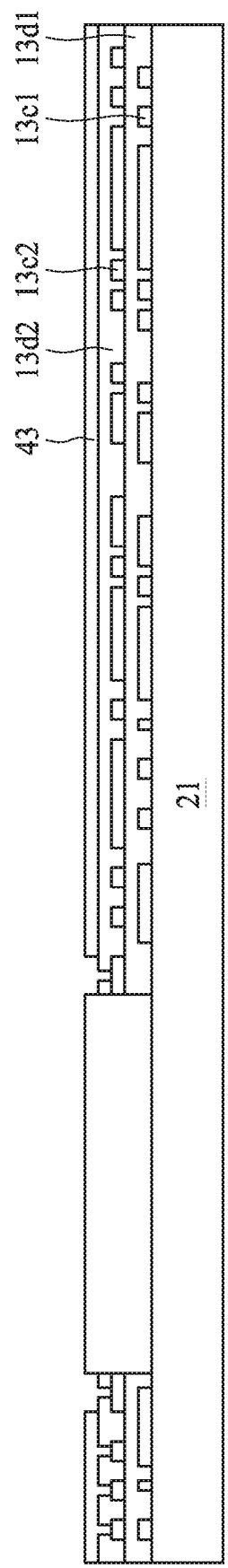

Referring to FIG. 4G, a photoresist layer 43 is formed. Portions of the photoresist layer 43 are in contact with the dielectric layer 13d2. Portions of the photoresist layer 43 are in contact with the conductive layer 13c2. The photoresist layer 43 includes one or more openings. In some embodiments, forming the photoresist layer 43 includes: applying a photoresist layer, exposing the photoresist through a mask, and etching the photoresist layer. A portion of the photoresist layer 43 is in contact with the carrier 21. Portions of the photoresist layer 43 are in contact with the conductive layer 13c2. The openings the photoresist layer 43 expose one or more openings of the dielectric layer 13d2 and portions of the dielectric layer 13d2. One or more openings of the photoresist layer 43 expose some portions of the conductive layer 13c2.

Figure 4H:
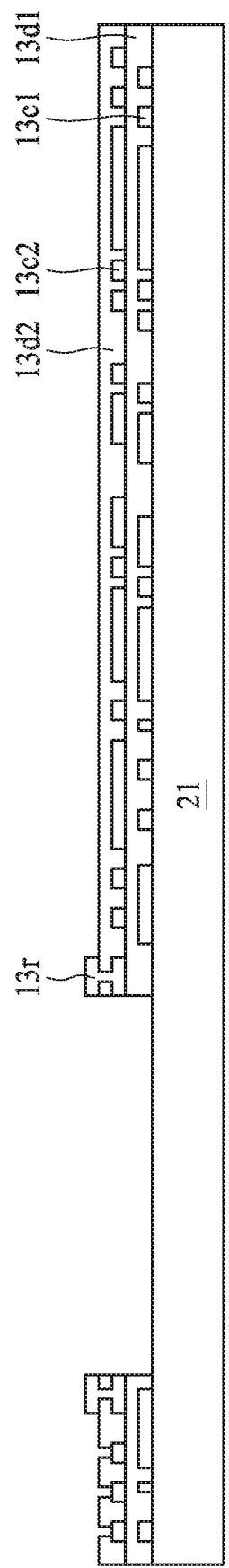

Referring to FIG. 4H, a ring structure 13r is formed. The ring structure 13r is in contact with the dielectric layer 13d2. In some embodiments, the ring structure 13r surrounds the openings that expose a portion of the carrier 21. In some embodiments, forming the conductive layer 13r includes forming the conductive layer 13r by physical vapor deposition, and removing (or striping) the photoresist layer 43. In some embodiments, a seed layer including titanium copper is formed before forming the conductive layer 13r. A portion of the carrier 21 is exposed.

Referring to FIG. 4I, a photoresist layer 44 is formed. A portion of the photoresist layer 44 is in contact with the carrier 21. Portions of the photoresist layer 44 are in contact with the ring structure 13r. Portions of the photoresist layer 44 are in contact with the dielectric layer 13d2. The photoresist layer 44 includes one or more openings. In some embodiments, forming the photoresist layer 44 includes: applying a photoresist layer, exposing the photoresist through a mask, and etching the photoresist layer. A portion of the photoresist layer 44 is in contact with the carrier 21. Portions of the photoresist layer 44 are in contact with the conductive layer (or ring structure) 13r. One or more openings of the photoresist layer 44 expose one or more openings of the dielectric layer 13d2 and portions of the dielectric layer 13d2. One or more openings of the photoresist layer 44 expose some portions of the conductive layer 13c2. In some embodiments, the height of the photoresist layer 44 is greater than a heights of one or more of the conductive layers 13c1, 13c2, and 13r and the dielectric layers 13d1 and 13d2.

Figure 4J:
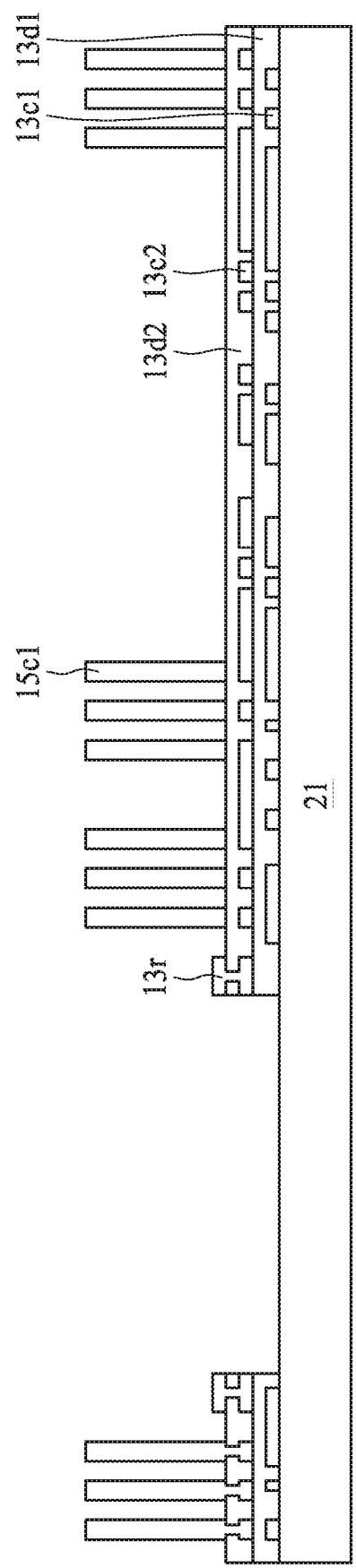

Referring to FIG. 4J, conductive pillars 15c1 are formed. Some of the conductive pillars 15c1 are in contact with the dielectric layer 13d2. Some of the conductive pillars 15c1 are in contact with the conductive layer 13c2. In some embodiments, forming the conductive pillars 15c1 includes forming the conductive pillars 15c1 by physical vapor deposition and removing (or striping) the photoresist layer 44. In some embodiments, a seed layer including titanium copper is formed before forming the conductive pillars 15c1. A portion of the carrier 21 is exposed. In some embodiments, the side wall 13s of the redistribution layer 13 has an Ra in a range from about 0.1 μm to about 0.2 μm.

Figure 5:
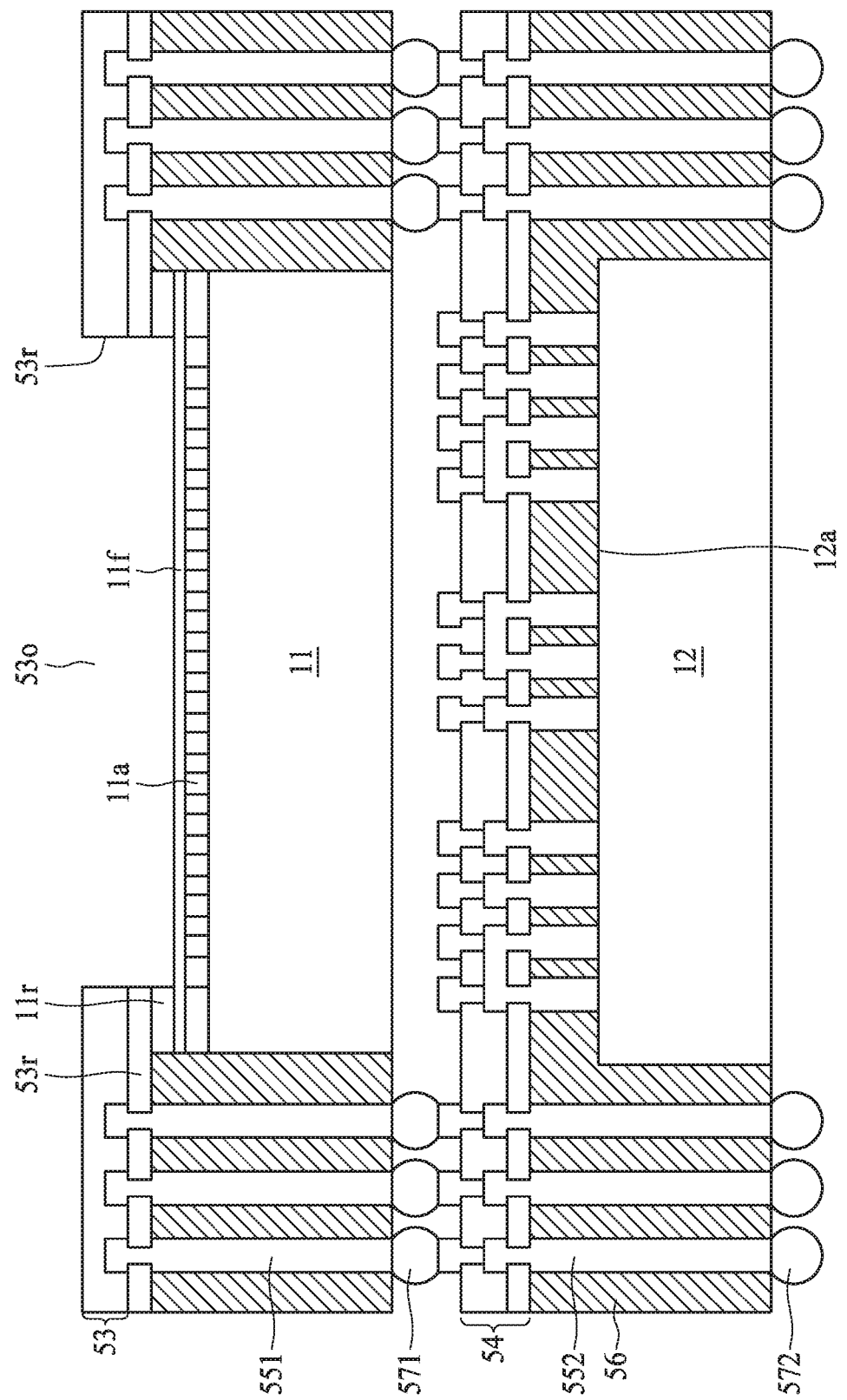
FIG. 5 is a schematic diagram illustrating a cross-sectional view of a semiconductor device package according to some embodiments of the present disclosure.

FIG. 5 is a schematic diagram illustrating a cross-sectional view of a semiconductor device package according to some embodiments of the present disclosure.

Referring to FIG. 5, the semiconductor device package 5 includes a semiconductor device 11, a semiconductor device 12, a redistribution layer 53, a redistribution layer 54, one or more conductive pillars 551, one or more conductive pillars 552, an encapsulant 56, and electrical contacts 571 and 572.

In some embodiments, the semiconductor device package 1 is applied to, or implemented in, a display or a display module. The semiconductor device 11 is, for example, a backplane IC including optical lighting components such as R/G/B LEDs. The semiconductor device 12 is, for example, a driver IC. The semiconductor device 12 is electrically connected to and drive the semiconductor device 11 such that the semiconductor device 11 can achieve full color illumination output by the color mixing principle of the three primary colors (R/G/B).

The semiconductor device package 5 of FIG. 5 is similar to the semiconductor device package 1 of FIG. 1. One difference between the semiconductor device package 5 shown in FIG. 5 and the semiconductor device package 1 shown in FIG. 1 is that the semiconductor device 11 and the semiconductor device 12 are stacked in a different manner. As shown in FIG. 5, the semiconductor device 11 is disposed on the semiconductor device 12. The semiconductor device 11 is disposed over the semiconductor device 12. The semiconductor device 11 is electrically connected to the semiconductor device 12 via the redistribution layer 53, the conductive pillar 551, electrical contacts 571, the redistribution layer 54 and the conductive pillar 552. Since the semiconductor device 11 and the semiconductor device 12 are stacked in a 3D package on package (PoP) manner, a time used for signal transmission between the semiconductor device 11 and the semiconductor device 12 can be reduced.

FIG. 6A, FIG. 6B, FIG. 6C and FIG. 6D illustrate a method for packaging a semiconductor device in accordance with some embodiments of the present disclosure. In some embodiments, the method in FIG. 6A, FIG. 6B, FIG. 6C and FIG. 6D can be used to package the semiconductor device 11 as shown in FIG. 5.

Figure 6B:
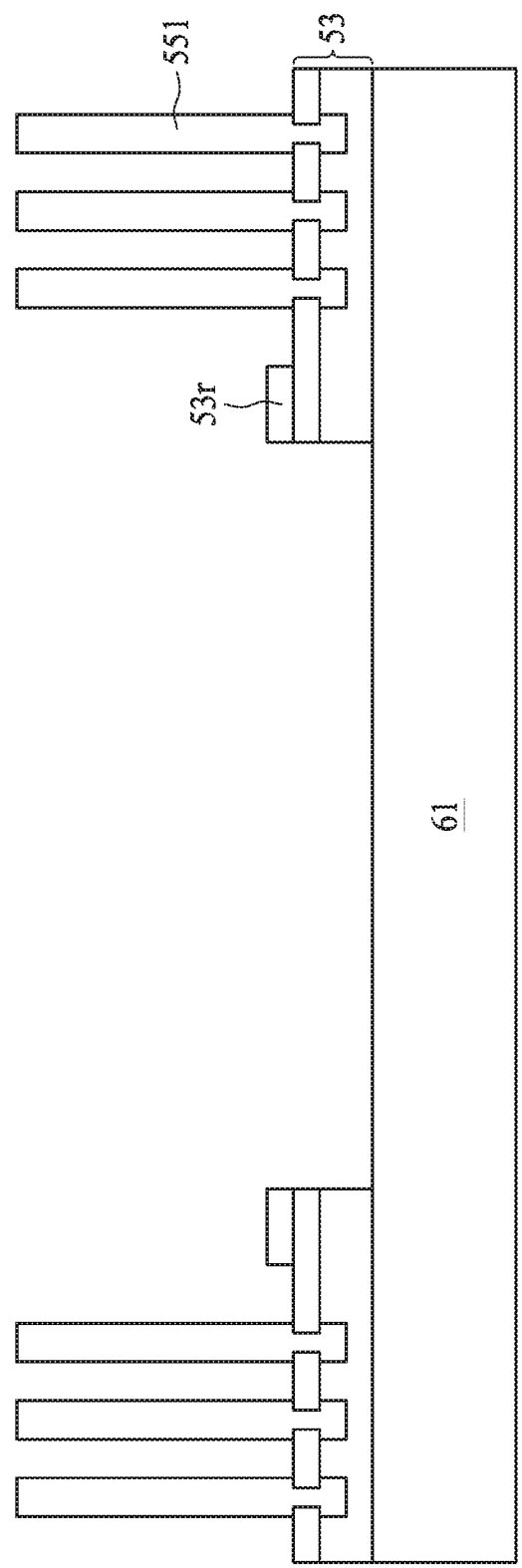
Figure 6C:
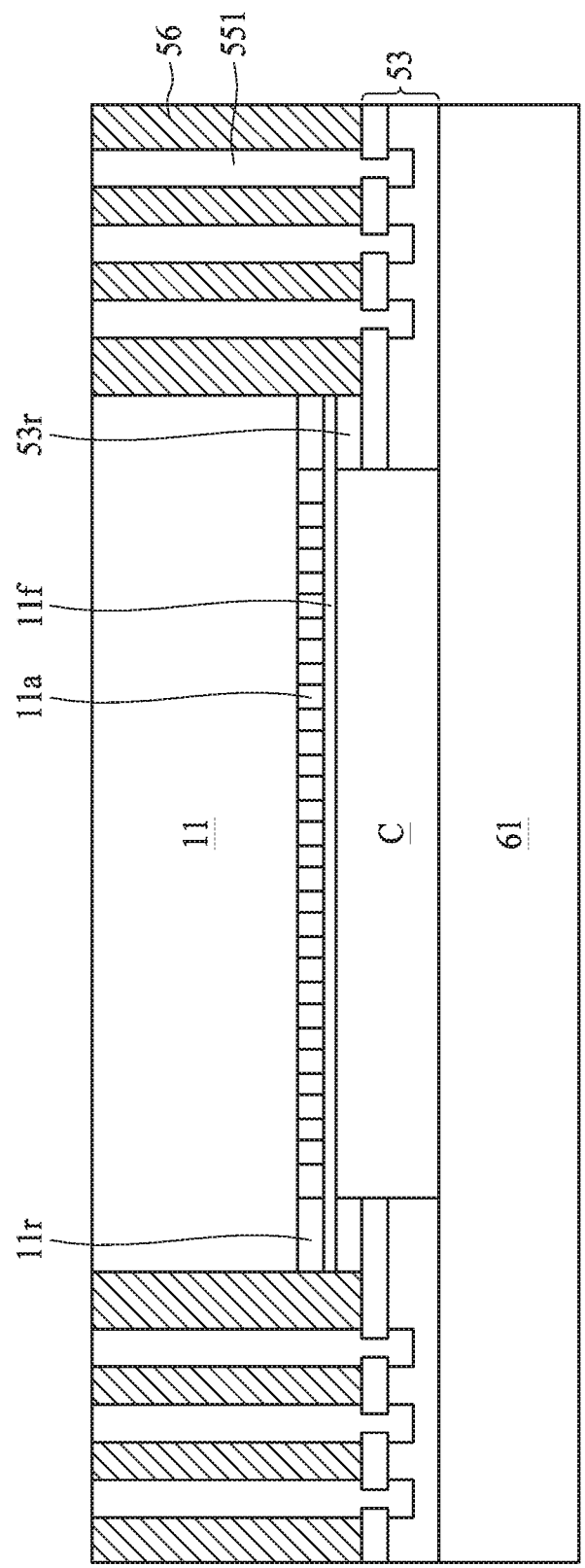
Figure 6D:
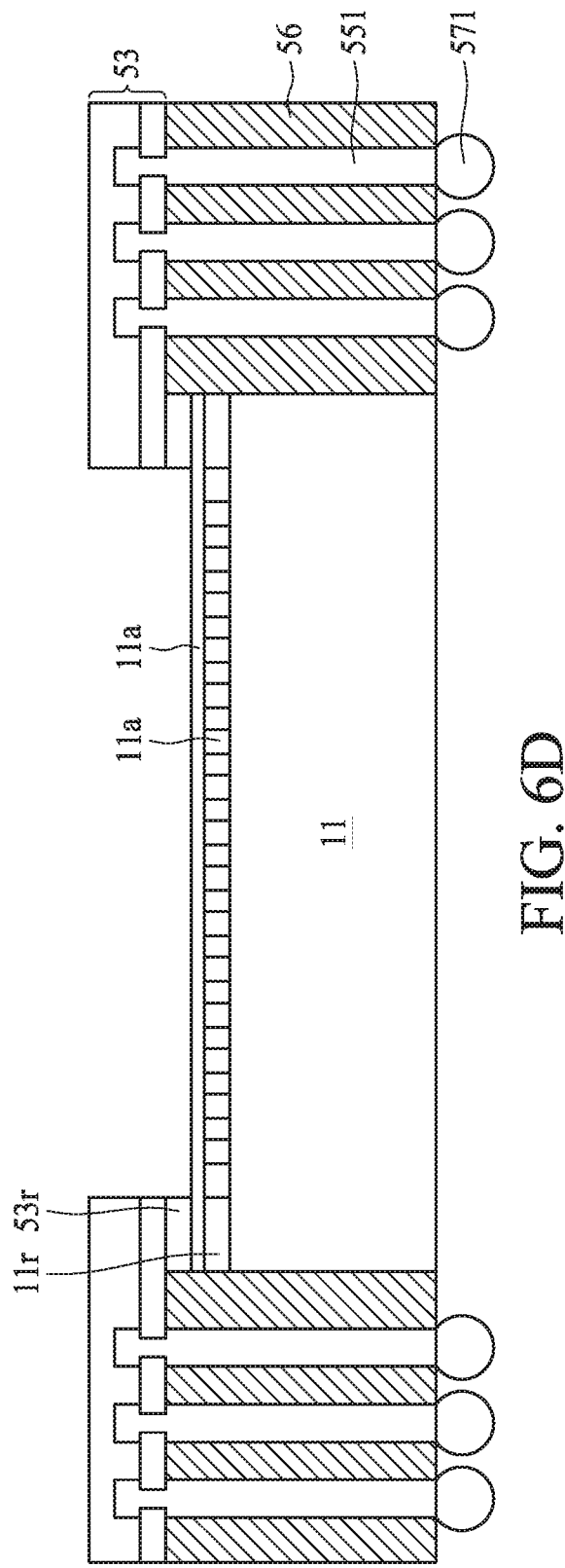

Referring to FIG. 6A, a carrier 61 is provided. In some embodiments, there is an adhesive layer (e.g., a tape or an adhesive film) disposed on the carrier 61. Referring to FIG. 6B, a redistribution layer 53 is formed on the carrier 61, one or more conductive pillars 551 are formed on the top surface of the redistribution layer 53, and a ring structure 53r is disposed on the top surface of the redistribution layer 53. Referring to FIG. 6C, a semiconductor device 11 is disposed on the ring structure 53r and on the redistribution layer 53, and an encapsulant 56 is used to encapsulate a portion of the semiconductor device 11 and lateral surfaces of the one or more conductive pillars 551. An active surface 11a of the semiconductor device 11 is exposed from the encapsulant 56. A cavity C is formed between the semiconductor device 11 and the carrier 61 (e.g. by disposed the semiconductor device 11 on the ring structure 53r such that a space is provided between the semiconductor device 11 and the carrier 61). Referring to FIG. 6D, an electrical contact 571 is provided and electrically connected to the conductive pillar 551. The carrier 61 is then removed.

FIG. 7A, FIG. 7B, FIG. 7C, FIG. 7D and FIG. 7E illustrate a method for packaging a semiconductor device in accordance with some embodiments of the present disclosure. In some embodiments, the method in FIG. 7A, FIG. 7B, FIG. 7C, FIG. 7D and FIG. 7E can be used to package the semiconductor device 12 as shown in FIG. 5.

Figure 7A:
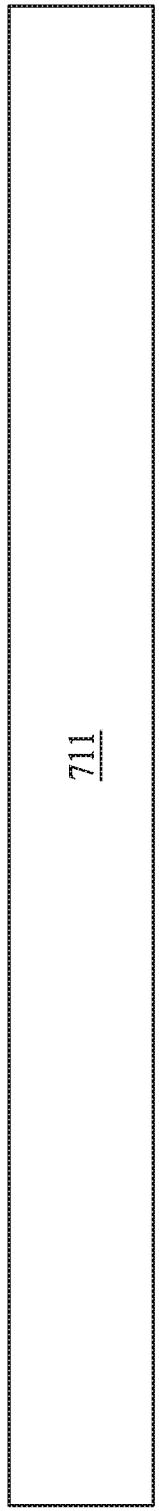
FIG. 7A, FIG. 7B, FIG. 7C, FIG. 7D and FIG. 7E illustrate a method for packaging a semiconductor device in accordance with some embodiments of the present disclosure.
Figure 7B:
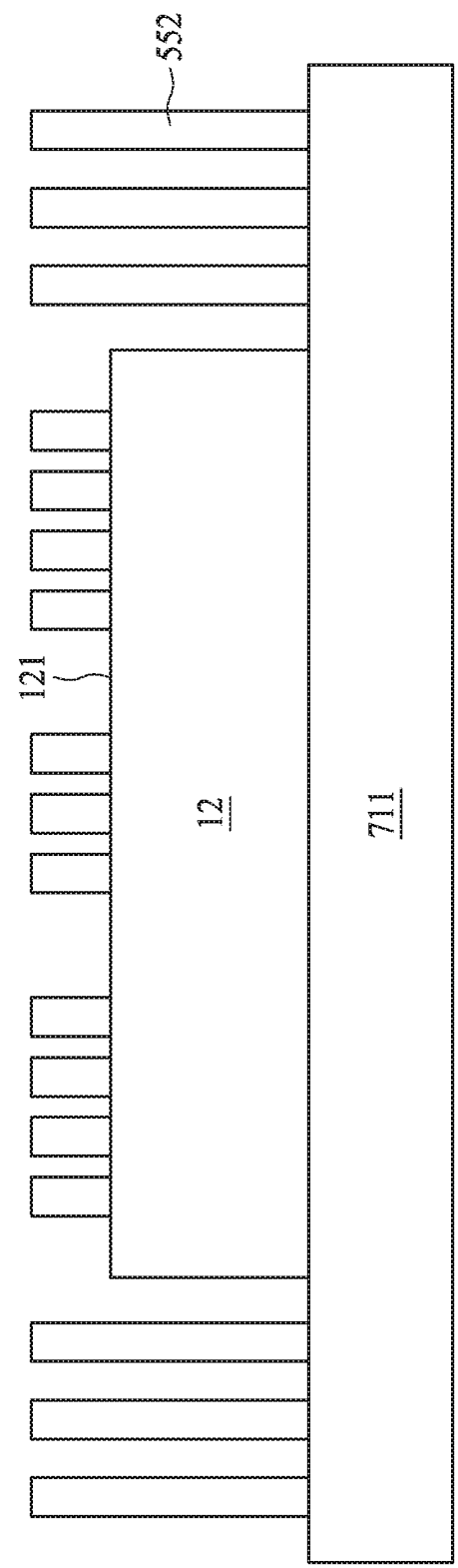

Referring to FIG. 7A, a carrier 711 is provided. In some embodiments, there is an adhesive layer (e.g., a tape or an adhesive film) disposed on the carrier 711. Referring to FIG. 7B, the semiconductor device 12 and one or more conductive pillars are provided. The semiconductor device 12 is disposed on an upper surface of the carrier 711. An active surface of the semiconductor device 12 faces away from the carrier 711. Some of the conductive pillars 552 surround the semiconductor device 12. Some of the conductive pillars 552 disposed on the upper surface of the carrier 711. Some of the conductive pillars 552 disposed on the active surface of the semiconductor device 12.

Figure 7C:
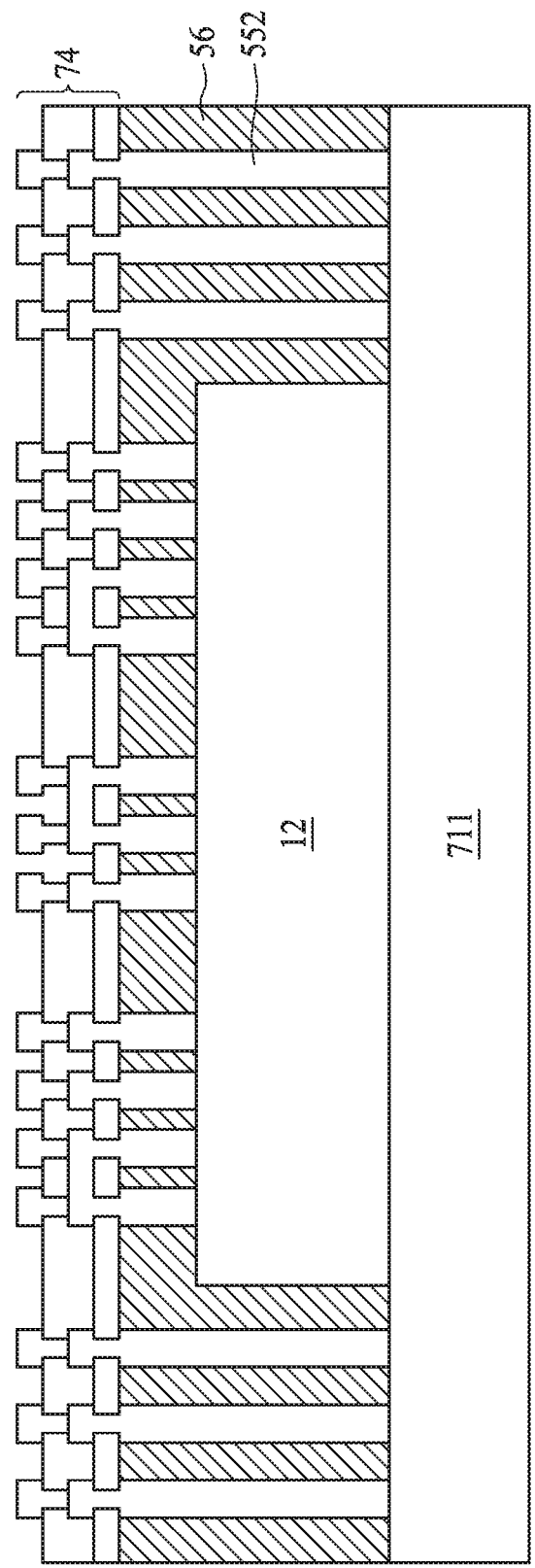
Figure 7D:
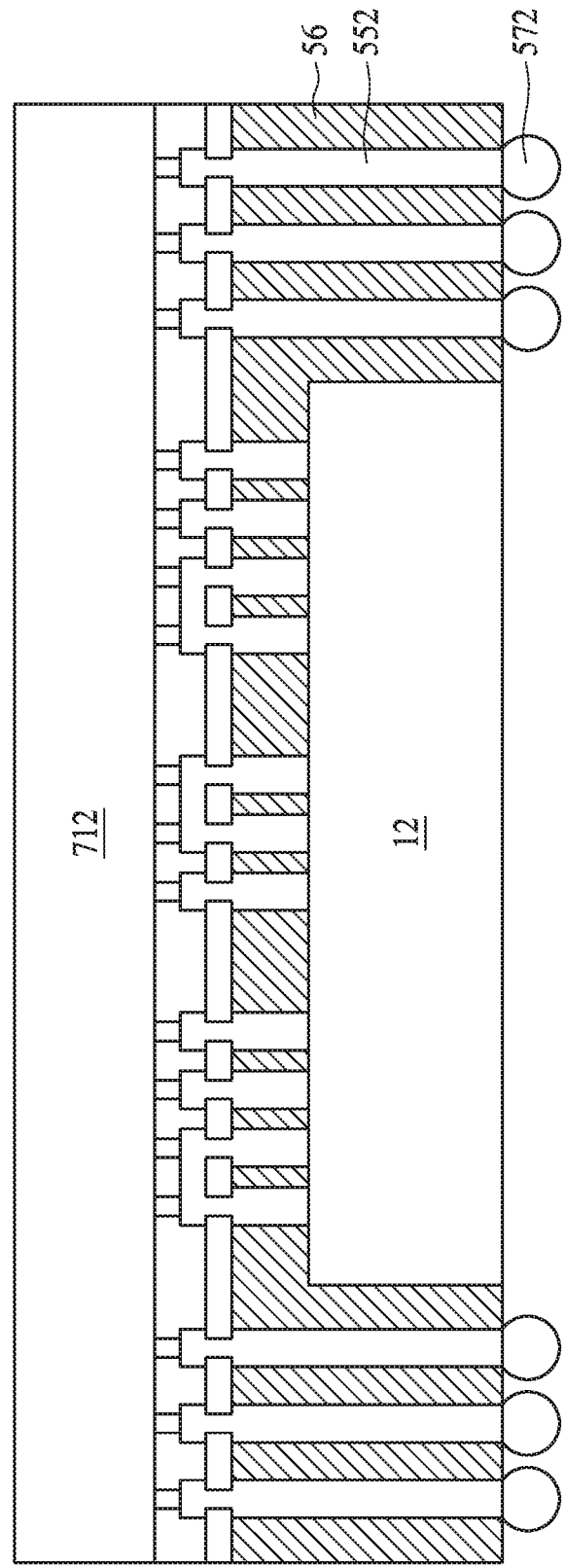
Figure 7E:
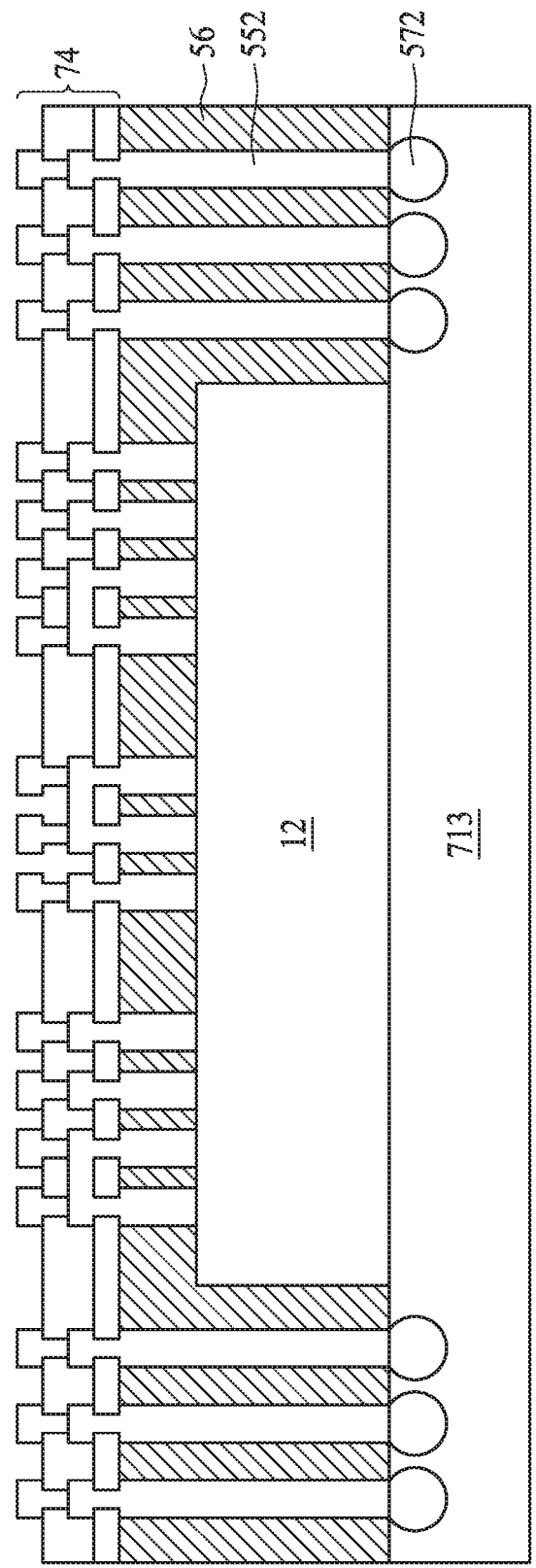

Referring to FIG. 7C, a carrier 711, a portion of the semiconductor device 12 and lateral surfaces of the one or more conductive pillars 552 are encapsulated by an encapsulant 56. A redistribution layer 74 is formed on a surface of the conductive pillars 552. Referring to FIG. 7D, a carrier 712 is provided. The carrier 711 is removed. One or more electrical contacts 572 (e.g., solder bumps) are provided. The one or more electrical contact 572 are electrically connected to the one or more conductive pillars 552. Referring to FIG. 7E, a carrier 713 is provided. The carrier 713 is in contact with the electrical contact 572, portions of the encapsulant 56, and an inactive surface of the semiconductor device 12 (e.g., a surface of the semiconductor device 12 opposite to the active surface of the semiconductor device 12.

Figure 8A:
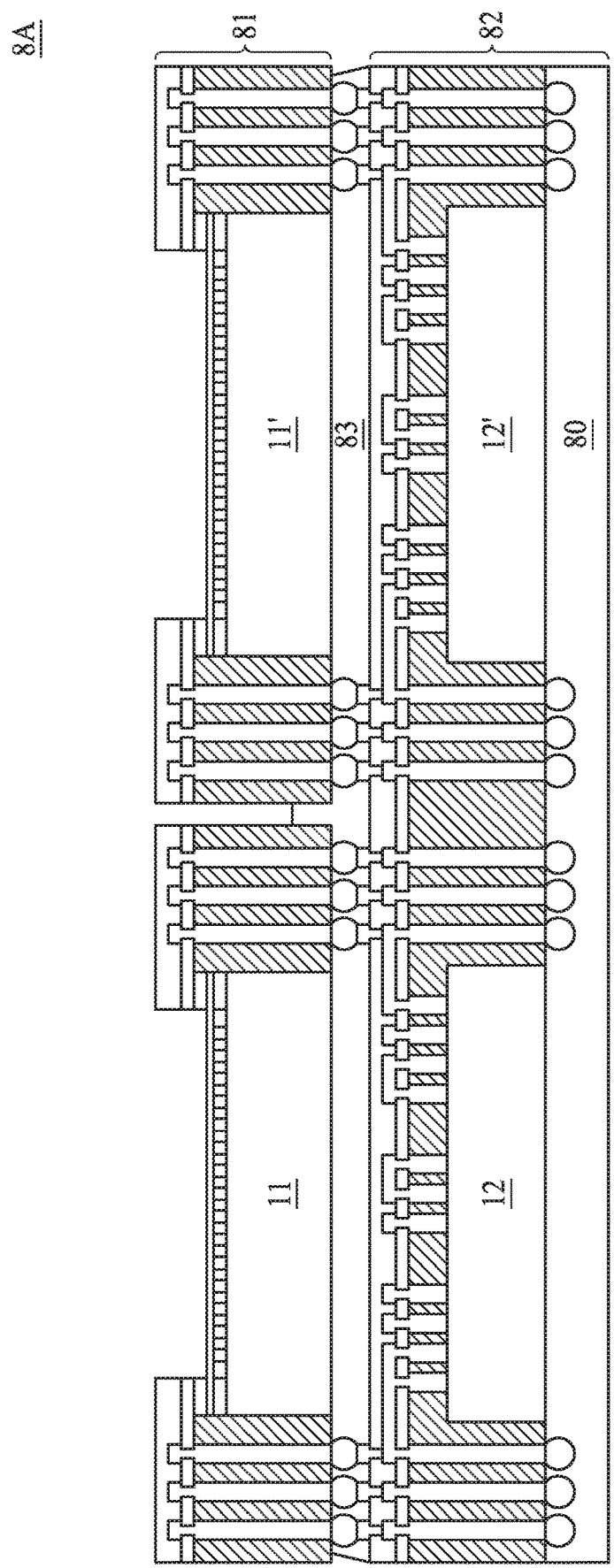
FIG. 8A and FIG. 8B illustrate a method for packaging a semiconductor device in accordance with some embodiments of the present disclosure.
Figure 8B:
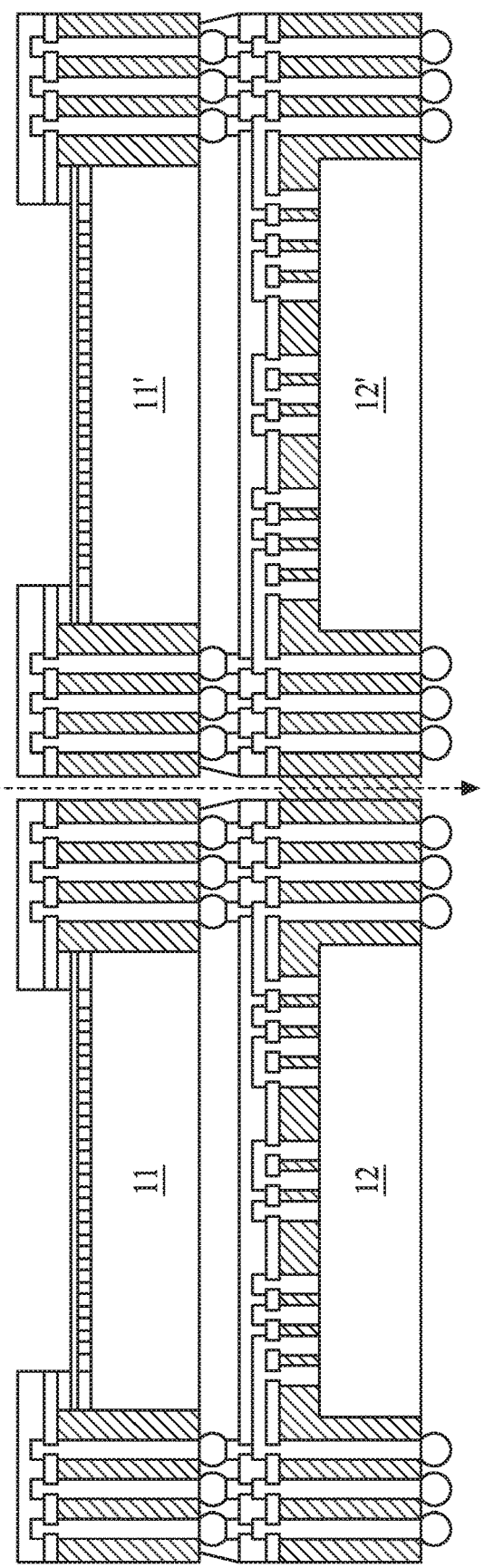

FIG. 8A and FIG. 8B illustrate a method for packaging a semiconductor device in accordance with some embodiments of the present disclosure. In some embodiments, the method in FIG. 8A and FIG. 8B can be used to form the semiconductor device package 5 as shown in FIG. 5.

Referring to FIG. 8A, the first semiconductor device package 81 and the second semiconductor device package 82 are provided. The first semiconductor device package 81 is disposed on the second semiconductor device package 82. The first semiconductor device package 81 is attached to the second semiconductor device package 82. The first semiconductor device package 81 is electrically connected to the second semiconductor device package 82. An underfill 83 is filled between the first semiconductor device package 81 and the second semiconductor device package 82. The first semiconductor device package 81 includes semiconductor devices 11 and 11'. Each of the semiconductor devices 11 and 11' is, for example, a backplane IC including optical lighting components such as R/G/B LEDs. The second semiconductor device package 82 includes semiconductor devices 12 and 12'. Each of the semiconductor devices 12 and 12' is, for example, a driver IC.

Referring to FIG. 8B, the carrier 80 is removed from the second semiconductor device package 82. Then, the structure 8B is cut in the direction indicated by the arrow shown in FIG. 8B so as to divide the structure 8B into two parts, each of which is, for example, the semiconductor device package 5 shown in FIG. 5.

Figure 9:
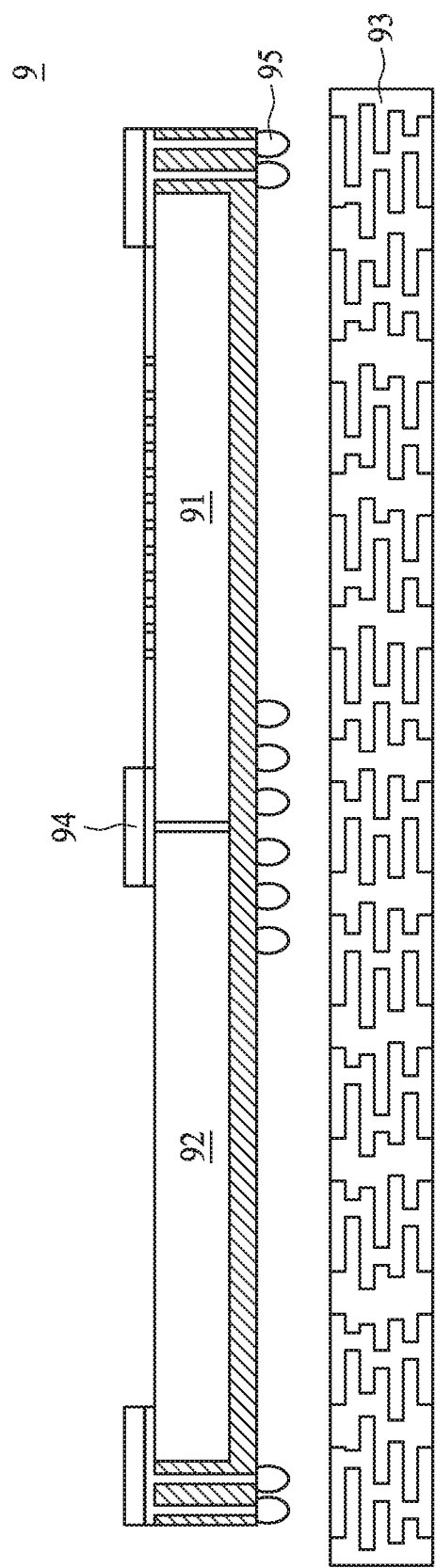
FIG. 9 is a schematic diagram illustrating a cross-sectional view of a comparative semiconductor device package.

FIG. 9 is a schematic diagram illustrating a cross-sectional view of a comparative semiconductor device package.

Referring to FIG. 9, the semiconductor device package 9 includes a semiconductor device 91, a semiconductor device 92, a printed circuit board (PCB) 93, a bridge 94, and a solder bump 95. The semiconductor device 91 is, for example, a backplane IC including optical lighting components such as R/G/B LEDs. The semiconductor device 92 is, for example, a driver IC. The semiconductor devices 91 and 92 can be electrically connected to the PCB 93 via the solder bump 95. The semiconductor devices 91 and 92 can be bonded to the PCB 93 via conductive wires. In some embodiments, for example, if the number of R/G/B LEDs is high or many I/O pins of the semiconductor devices 91 and 92 are implemented, then the conductive wires or I/O pins may be prone to breakage. Certain features described herein (e.g., features implemented in the semiconductor device package 1 or the semiconductor device package 5) provide for solutions to this problem.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

As used herein, the terms "substantially," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, the term "about" or "substantially" equal in reference to two values can refer to a ratio of the two values being within a range between and inclusive of 0.9 and 1.1

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure, as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a first semiconductor device having a first active surface, and comprising a first ring structure;
   a second semiconductor device having a second active surface and a backside surface opposite to the second active surface; and
   a first redistribution layer disposed on the first active surface of the first semiconductor device and on the backside surface of the second semiconductor device, wherein the first redistribution layer has a side wall defining an opening that exposes the first active surface of the first semiconductor device, and the backside surface of the second semiconductor device is attached to the first redistribution layer, and the first redistribution layer comprises a second ring structure, wherein the side wall of the first redistribution layer has an average surface roughness (Ra) in a range up to 2 micrometers (μm).

2. The semiconductor device package of claim 1, further comprising a second redistribution layer opposite to the first redistribution layer, wherein the first semiconductor device and the second semiconductor device are disposed between the first redistribution layer and the second redistribution layer, and the second active surface of the second semiconductor device faces the second redistribution layer.

3. The semiconductor device package of claim 2, wherein the second active surface of the second semiconductor device is electrically connected to the second redistribution layer through a plurality of first conductive pillars, and an encapsulant encapsulating the first semiconductor device and the second semiconductor device extends between the plurality of first conductive pillars.

4. The semiconductor device package of claim 3, wherein each of the plurality of first conductive pillars has a surface substantially coplanar with a surface of the encapsulant.

5. The semiconductor device package of claim 2, further comprising a second conductive pillar at a side of the second semiconductor device and electrically connect the first redistribution layer to the second redistribution layer.

6. The semiconductor device package of claim 5, wherein the second conductive pillar is disposed between the first semiconductor device and the second semiconductor device.

7. The semiconductor device package of claim 1, wherein the first active surface of the first semiconductor device has a first area, and wherein the opening exposes the first area of the first semiconductor device, wherein the opening has a width substantially the same as that of the first area of the first semiconductor device.

8. The semiconductor device package of claim 1, wherein the backside surface of the second semiconductor device has an elevation different from that of a backside surface of the first semiconductor device.

9. The semiconductor device package of claim 1, wherein the backside surface of the second semiconductor device is non-coplanar with the first active surface of the first semiconductor device.

10. The semiconductor device package of claim 1, wherein the backside surface of the second semiconductor device is more closer to the first redistribution layer than the first active surface of the first semiconductor device is.

11. The semiconductor device package of claim 1, wherein the first ring structure is disposed on the second ring structure.

12. The semiconductor device package of claim 11, wherein the second ring structure surrounds the side wall of the first redistribution layer.

13. The semiconductor device package of claim 11, further comprising an adhesive layer between the first ring structure and second ring structure.

* * * * *